(12) United States Patent
Li et al.

(10) Patent No.: US 10,141,347 B2
(45) Date of Patent: Nov. 27, 2018

(54) ARRAY SUBSTRATE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Feng Li, Beijing (CN); Baoqiang Wang, Beijing (CN); Sangjin Park, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/329,513

(22) PCT Filed: Aug. 26, 2016

(86) PCT No.: PCT/CN2016/096887
§ 371 (c)(1),
(2) Date: Jan. 26, 2017

(87) PCT Pub. No.: WO2017/059752
PCT Pub. Date: Apr. 13, 2017

(65) Prior Publication Data
US 2017/0271371 A1    Sep. 21, 2017

(30) Foreign Application Priority Data
Oct. 8, 2015  (CN) .......................... 2015 1 0644208

(51) Int. Cl.
H01L 29/04      (2006.01)
H01L 27/12      (2006.01)
(Continued)

(52) U.S. Cl.
CPC ...... H01L 27/124 (2013.01); H01L 29/41733 (2013.01); H01L 29/42384 (2013.01)

(58) Field of Classification Search
CPC .......... H01L 27/124–27/1244; H01L 27/3248; H01L 27/3297; H01L 29/42384;
(Continued)

(56) References Cited

U.S. PATENT DOCUMENTS

2010/0328292 A1* 12/2010 Akiyama ................. G09G 3/20
345/211
2011/0090205 A1* 4/2011 Ito ..................... G02F 1/133305
345/211

(Continued)

FOREIGN PATENT DOCUMENTS

CN       101443699 A      5/2009
CN       103472963 A      12/2013
(Continued)

OTHER PUBLICATIONS

International Search Report and Written Opinion dated Oct. 31, 2016; PCT/CN2016/096887.
The First Chinese Office Action dated Aug. 15, 2017; Appln. 201510644208.1.

Primary Examiner — Kevin M Picardat
(74) Attorney, Agent, or Firm — Ladas & Parry LLP

(57) ABSTRACT

Disclosed are an array substrate and a display device. The array substrate comprises a plurality of first data lines (1) parallel to a short side of the array substrate, a plurality of second data lines (2) parallel to a long side of the array substrate, a first integrated circuit (3) arranged in a short-side frame. The plurality of second data lines (2) are configured for connecting the first integrated circuit (3) with the plurality of first data lines (1), and the first integrated circuit (3) transmits data signal to the plurality of first data lines (1) through the plurality of second data lines (2). The (Continued)

first integrated circuit for transmitting signals to the data lines is arranged in the short-side frame, so that there is no more integrated circuit arranged in the long-side frame, thereby reducing the border-width of the long-side frame and increasing the visual effect for the viewer.

14 Claims, 3 Drawing Sheets

(51) Int. Cl.
*H01L 29/417* (2006.01)
*H01L 29/423* (2006.01)

(58) Field of Classification Search
CPC ...... H01L 29/41733; H01L 27/1214–27/1296; H01L 27/3244–27/3279; G02F 1/136286–2001/136295; G02F 1/1362–2001/13685
See application file for complete search history.

(56) References Cited

U.S. PATENT DOCUMENTS

| | | | |
|---|---|---|---|
| 2011/0128261 A1* | 6/2011 | Hung | G02F 1/136286 345/205 |
| 2014/0043306 A1* | 2/2014 | Min | G09G 3/3685 345/204 |
| 2014/0138717 A1* | 5/2014 | Kong | G02F 1/133555 257/88 |

FOREIGN PATENT DOCUMENTS

| | | |
|---|---|---|
| CN | 103578443 A | 2/2014 |
| CN | 104464603 A | 3/2015 |
| CN | 104640390 A | 5/2015 |
| CN | 105206623 A | 12/2015 |
| JP | 2015-099200 A | 5/2015 |

\* cited by examiner

ARRAY SUBSTRATE AND DISPLAY DEVICE

TECHNICAL FIELD

Embodiments of the present invention relate to display technology, more specifically, to an array substrate and a display device.

BACKGROUND

The display device usually adopts a widescreen display panel, that is, the long side of the display panel is significantly longer than its short side, so as to adapt to human eyes which are distributed laterally.

A plurality of gate lines parallel to the long side and a plurality of data lines parallel to the short side are arranged in the display panel. The integrated circuit for transmitting data signals to data lines is located in the long-side frame, and the integrated circuit for transmitting scanning signals to gate lines is located in the short-side frame. As the human eyes have different levels of sensitivity between the long-side frame and the short-side frame, the viewing of the human eyes are actually apt to be disturbed by the long-side frame even if the long-side frame has the same border-width as the short-side frame. However, it is difficult to reduce the border-width of the long-side frame due to the presence of the integrated circuit for transmitting data signals to data lines.

SUMMARY

The present invention intends to resolve the technical problem how to reduce the border-width of the long-side frame of the array substrate.

In a first aspect of the present invention, it is provided an array substrate, which comprises a plurality of first data lines, parallel to a short side of the array substrate; a plurality of second data lines, parallel to a long side of the array substrate; a first integrated circuit, arranged in a short-side frame; wherein the plurality of the second data lines are configured for connecting the first integrated circuit with the plurality of the first data lines; the first integrated circuit transmits data signal to the plurality of first data lines through the plurality of second data lines.

In a second aspect of the present invention, it is provided a display device, which comprises the aforementioned array substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
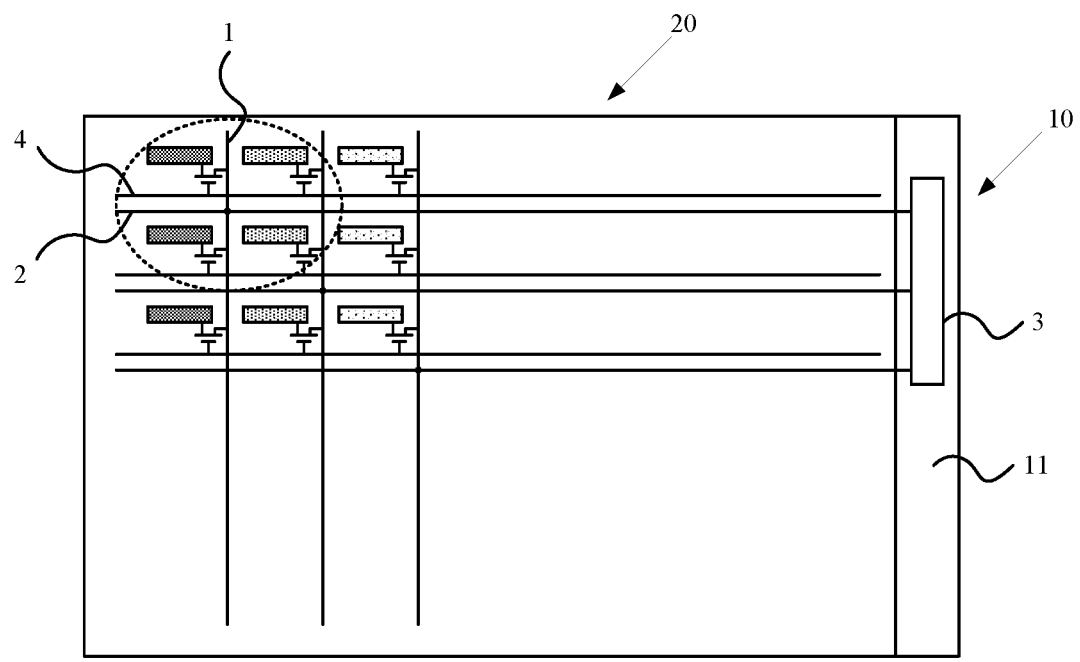
FIG. 1 schematically illustrates an array substrate according to an embodiment of the present invention.
Figure 2:
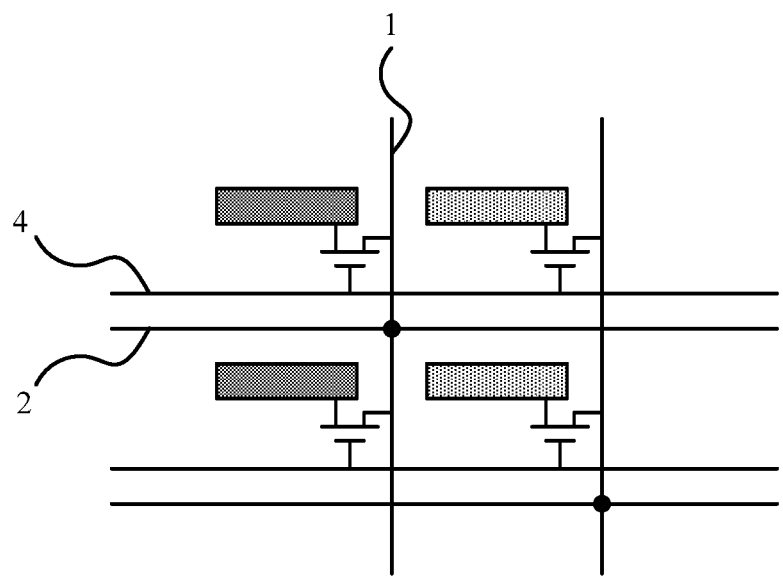
FIG. 2 schematically illustrates a configuration of part of the array substrate in the dashed line of FIG. 1.

As illustrated in FIG. 1 and FIG. 2, the array substrate according to an embodiment of the present invention comprises: a plurality of first data lines 1 parallel to the short side 10, i.e., extending in vertical direction; a plurality of second data lines 2 parallel to the long side 20, i.e., extending in horizontal direction; a first integrated circuit 3, arranged in the short-side frame 11. The plurality of second data lines 2 is configured for connecting the first integrated circuit 3 with the plurality of first data lines 1, and the first integrated circuit 3 transmits signals to the plurality of first data lines 1 through the plurality of second data lines 2. Each of the first data lines 1 and each of the second data lines 2 are perpendicular to each other.

The first integrated circuit 3 for transmitting signals to the first data lines 1 is arranged in the short-side frame 11, so that there is no more integrated circuit arranged in the long-side frame, thereby reducing the border-width of the long-side frame and increasing the visual effect for the viewer.

In at least some of the embodiments, the array substrate further comprises m gate lines 4 parallel to the long side 20 for transmitting scanning signals to pixels. The plurality of second data lines 2 are m second data lines 2, and each of second data lines 2 is parallel to each of the gate lines 4.

In the present embodiment, the amount of the second data lines 2 may be equal to the amount of the gate lines 4. The second data lines 2 may be further arranged parallel to gate lines 4. For example, each of the second data lines 2 is arranged on a side of each of gate lines 4.

In at least some of the embodiments, the array substrate further comprises source and drain electrodes, and the plurality of first data lines 1 is n first data lines 1. The n first data lines 1 are located in the same layer as the source and drain electrodes, the m second data lines 2 are located in the same layer as the m gate lines 4. A gate insulation layer is arranged between the n first data line 1 and the m second data lines 2, and the first data line 1 and the second data line 2 are connected with each other through via holes in the gate insulation layer.

The first data lines 1 and the source and drain electrodes are arranged in the same layer, and the second data lines 2 and the gate lines 4 are arranged in the same layer, such that the first data lines are formed at the same time of fabricating the source and drain electrodes, and the second data lines 2 are formed at the same time of fabricating the gate lines 4, thereby simplifying the manufacturing process.

In at least some of the embodiments, m>n, n of the m second data lines 2 are in one-to-one correspondence with the n first data lines 1 respectively, and the remaining second data lines 2 of the m second data lines 2 are suspended.

In order to ensure that each of the first data lines 1 normally transmits signals to pixels, at least one of the second data lines 2 corresponds to one of the first data lines 1, i.e., ensuring m≥n.

The gate line in the present embodiment may be of Triple Gate structure. That is, as to the array substrate with resolution of p*q, the amount of the gate lines is $3q$. As for general array substrate, $3q>p$, i.e., m>n. Therefore, n second data lines 2 of m second data lines 2 are connected to n first data lines correspondingly, such that the first integrated circuit 3 could normally transmit data signals to n first data lines 1 through n second data lines 2.

In at least some of the embodiments, one suspended second data line is arranged for every predetermined amount (at least one) of second data lines 2. In other words, at least one second data line 2, which is connected to the first data line 1, is arranged between two adjacent suspended second data lines.

Since the suspended second data lines 2 are not interconnected with other lines, they do not transmit signals and thus do not generate heat. Therefore, arranging one suspended second data line for every predetermined amount of second data lines 2 can reduce the collective heating of the plurality of second data lines 2.

Figure 5:
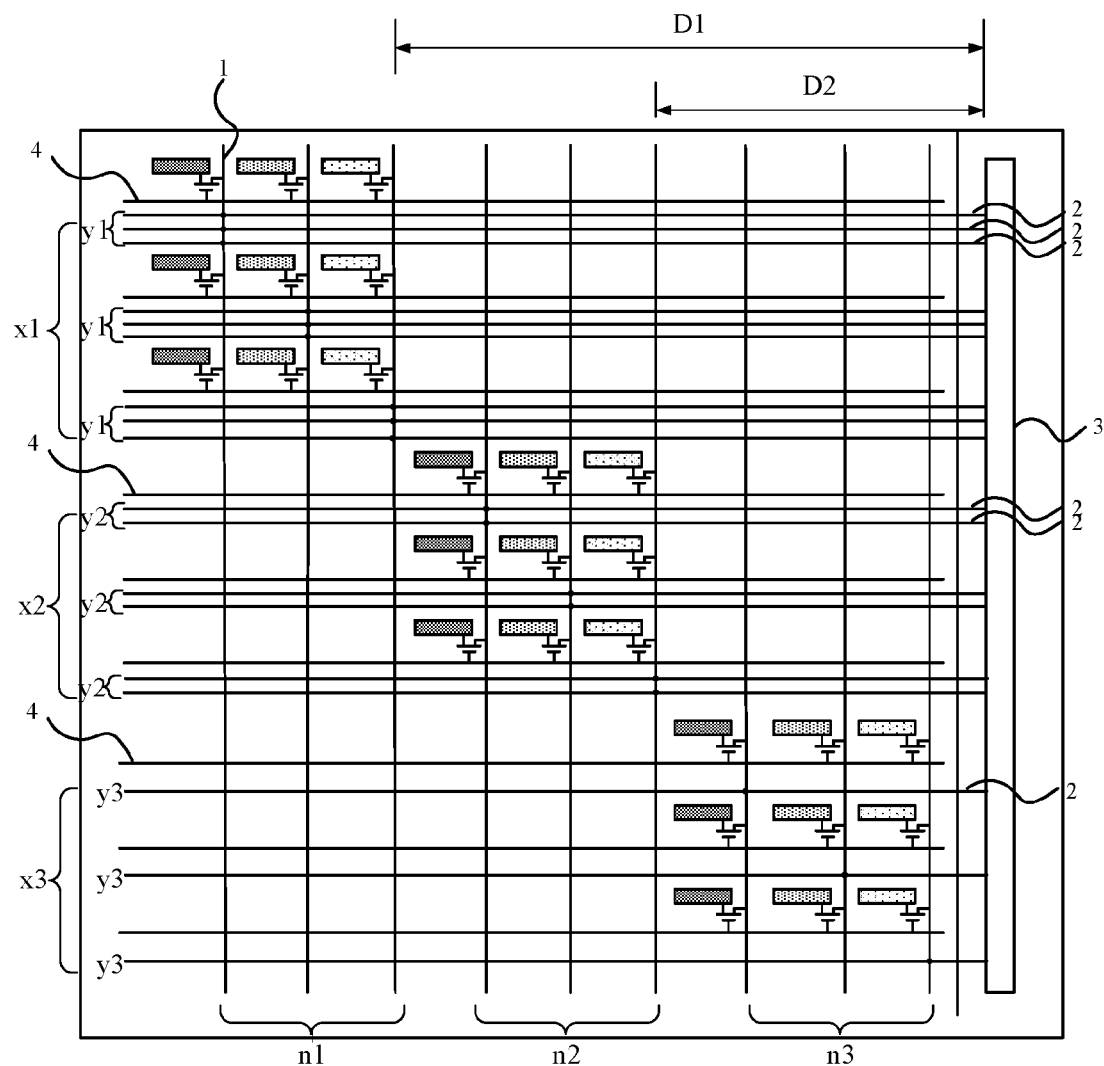
FIG. 5 schematically illustrates an array substrate according to still another embodiment of the present invention.

In at least some of the embodiments, m>n, and n of the m second data lines 2 are in one-to-one correspondence with the n first data lines 1. The remaining second data lines of the m second data lines 2 includes (as illustrated in FIG. 5):

$x_1$ second data lines 2, wherein every $y_1$ second data lines 2 of $x_1$ second data lines 2 are connected to one of $n_1$ first data lines 1, and the distance between each of $n_1$ first data lines 1 and the first integrated circuit 3 is greater than or equal to the first distance D1; and $x_2$ second data lines 2, wherein every $y_2$ second data lines 2 of $x_2$ second data lines 2 are connected to one of $n_2$ first data lines 1, and the distance between each of $n_2$ first data lines 1 and the first integrated circuit 3 is less than the first distance D1 and greater than or equal to the second distance D2; and . . . .

$x_n$ second data lines 2, wherein every $y_n$ second data lines 2 are connected to one of $n_i$ first data lines 1, and the distance between each of $n_i$ first data lines 1 and the first integrated circuit 3 is less than the $(n-1)^{th}$ distance $D_{n-1}$ and greater than or equal to the $n^{th}$ distance $D_n$.

Herein, $x_n$ and i are both integers greater than 0, $y_n$ is an integer which could exactly divide $x_n$ with no remainder, n is an integer greater than 1, $x_1+x_2+ \ldots +x_n=m-n$, and $n_1+n_2+ \ldots +n_i=n_o$ In the present embodiment, the farther a portion of first data lines is away from the first integrated circuit 3, the more second data lines are connected to the portion of first data lines, so that the resistance between the first integrated circuit 3 and the farther first data lines 1 is similar to the resistance between the first integrated circuit 3 and the closer first data lines 1, thereby reducing signal delay while the signal is transmitted to the farther first data lines 1.

For example, as illustrated in FIG. 5, as for the portion of the first data lines which is farthest away from the first integrated circuit 3 (greater than or equal to the first distance D1), each first data line 1 is connected to three second data lines 2; as for the portion of the first data lines which is farther away from the first integrated circuit 3 (less than the first distance D1 and greater than or equal to the second distance D2), each first data line 1 is connected to two second data lines 2; as for the portion of the first data lines which is closest to the first integrated circuit 3 (less than the second distance D2), each first data line 1 is connected to one second data line 2.

In the case that the amount of second data lines 2 are greater than that of the first data lines 1, as long as the n second data lines 2 are connected to the n first data lines 1 in one-to-one correspondence, the signal can be normally transmitted from the first integrated circuit 3 to the n first data lines 1 through the n second data lines.

For example, more second data lines 2 are connected to the first data lines 1 which are farther away from the first integrated circuit 3, and less second data lines 2 are connected to the first data lines 1 which are closer to the first integrated circuit 3, such that the resistance between the first integrated circuit 3 and the farther first data lines 1 is similar to the resistance between the first integrated circuit 3 and the closer first data lines 1, thereby reducing signal delay while the signal is transmitted to the farther first data lines 1.

Figure 3:
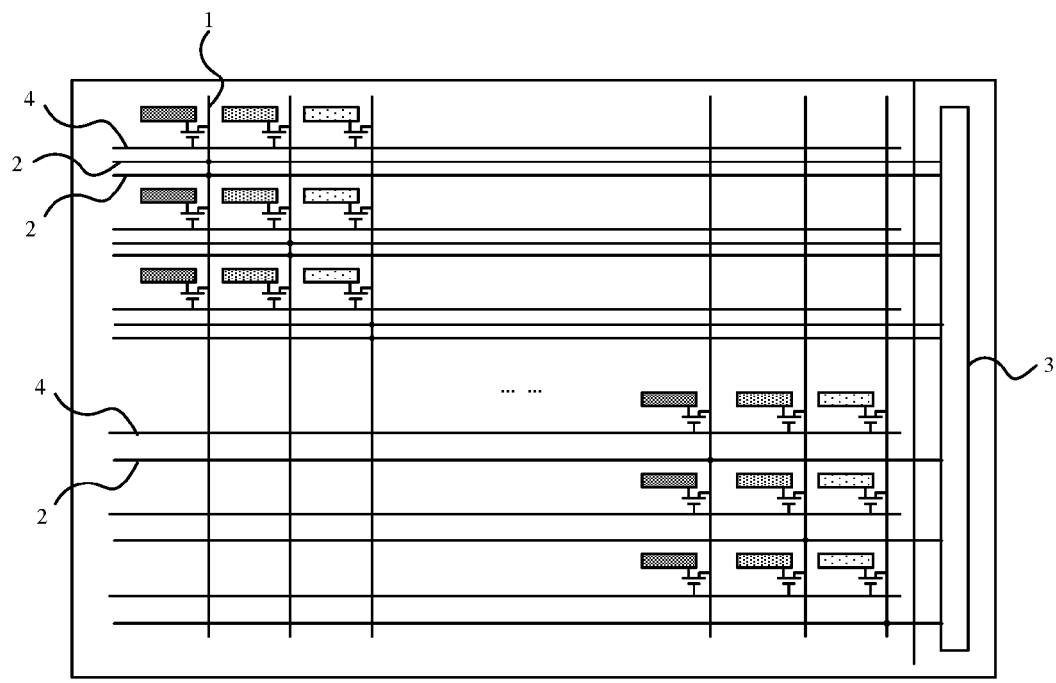
FIG. 3 schematically illustrates an array substrate according to another embodiment of the present invention.

It can be understood that the present embodiment is merely an example, and the amount of the second data lines 2 arranged for connecting to the first data lines 1 may be selected as required. As illustrated in FIG. 3, for example, two second data lines 2 are connected to each of the first data lines 1 which are farther away from the first integrated circuit 3, and one second data line 2 is connected to each of the first data lines 1 which are closer to the first integrated circuit 3.

In at least some of the embodiments, m=n, m second data lines 2 are connected to n first data lines 1 in a one-to-one correspondence.

Figure 4:
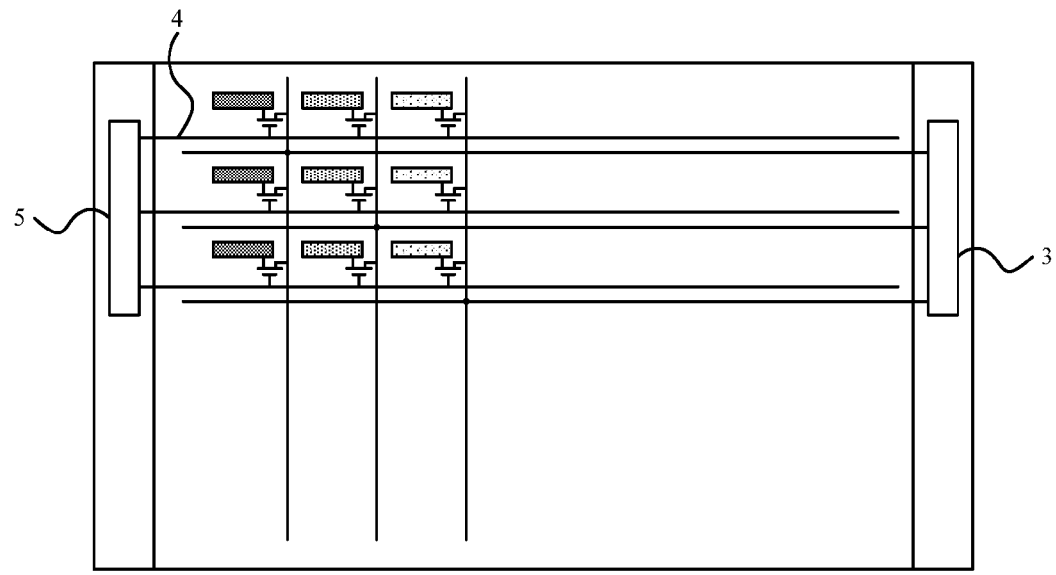
FIG. 4 schematically illustrates an array substrate according to yet another embodiment of the present invention.

As illustrated in FIG. 4, in at least some of the embodiments, the array substrate further comprises a second integrated circuit 5, which is arranged in the short-side frame opposed to the short side where the first integrated circuit 3 is located and is configured for transmitting scanning signals to the gate lines 4.

Due to the fact that the first integrated circuit 3 and the second integrated circuit 5 are not arranged in the frame of the same short side, the border-left-width and the border-right-width of the frame may be substantially same.

In at least some of the embodiments, the amount of the first integrated circuits 3 is plural, and each of the first integrated circuit 3 transmits data signal to a predetermined amount of the second data lines 2 which is away from the first integrated circuit 3 less than a predetermined distance.

In the present embodiment, each of the first integrated circuit 3 is connected to the second data lines 2 which are closer to the first integrated circuit, such that the first integrated circuit 3 is not too far away from the second data lines 2, thereby reducing the transmission delay of the data signals.

Embodiments of the present invention further provide a display device comprising the array substrate mentioned above.

It is noted that, the display device in the present embodiment may be any product or component with display function, such as electronic paper, mobile phones, tablet computers, TVs, laptop computers, digital photo frames, navigators and the like.

The technical solution of embodiments of the present invention is detailed with reference to the attached drawings. In view of the fact that in the prior art the long-side frame of the widescreen displayer is apt to impact the visual experience of the viewer, whereas it is difficult to reduce the border-width of the long-side frame due to the existence of the integrated circuit for transmitting data signals to the data lines. According to the technical solution of embodiments of the present invention, the first integrated circuit for transmitting signals to the data lines is arranged in the short-side frame, so that there is no more integrated circuit arranged in the long-side frame, thereby reducing the border-width of the long-side frame and increasing the visual effect for the viewer.

What is described above is related to the illustrative embodiments of the disclosure only and not limitative to the scope of the disclosure; the scopes of the disclosure are defined by the accompanying claims.

The present application claims the priority of Chinese patent application No. 201510644208.1 filed on Oct. 8, 2015, the disclosure of which is incorporated herein by reference in its entirety.

The invention claimed is:

1. An array substrate comprising:
a plurality of gate lines;
a plurality of first data lines, parallel to a short side of the array substrate;
a plurality of second data lines, parallel to a long side of the array substrate;
a first integrated circuit, arranged in a short-side frame;
wherein the plurality of the second data lines are configured for connecting the first integrated circuit with the plurality of the first data lines; the first integrated circuit transmits data signal to the plurality of first data lines through the plurality of second data lines;
wherein an amount of the plurality of gate lines is same as an amount of the plurality of second data lines and both of them are m, and an amount of the plurality of first data lines is n;
wherein m>n, n second data lines of the m second data lines are connected to the n first data lines in one-to-one correspondence, and remaining second data lines are suspended.

2. The array substrate of claim 1, wherein the plurality of gate lines are parallel to the long side of the array substrate and configured for transmitting scanning signal to each pixel on the array substrate, wherein each of the plurality of second data lines is parallel to each of the plurality of the gate lines.

3. The array substrate of claim 2, wherein, the plurality of gate lines and the plurality of second data lines are located in same layer.

4. The array substrate of claim 2, further comprising source and drain electrodes, wherein the plurality of the first data lines and the source and drain electrodes are located in same layer, a gate insulation layer is arranged between the plurality of first data lines and the plurality of second data lines, and each of the first data lines and its corresponding second data line are connected with each other through a via hole in the gate insulation layer.

5. The array substrate of claim 1, wherein at least one second data line connected to the first data line is arranged between two adjacent suspended second data lines.

6. The array substrate of claim 1, wherein n second data lines of the m second data lines are connected to the n first data lines in one-to-one correspondence; in condition that a portion of the first data lines are away from the first integrated circuit greater than or equal to a first distance, an additional second data line is arranged for each first data line of the portion of the first data lines.

7. The array substrate of claim 2, further comprising:
a second integrated circuit, arranged in a short-side frame opposed to the short-side frame where the first integrated circuit is located and the second integrated circuit is configured for transmitting scanning signals to gate lines.

8. The array substrate of claim 1, wherein an amount of the first integrated circuits is plural, and each of the first integrated circuits is connected to a portion of second data lines and transmits data signal to the portion of second data lines.

9. A display device, comprising the array substrate of claim 1.

10. An array substrate comprising:
a plurality of gate lines;
a plurality of first data lines, parallel to a short side of the array substrate;
a plurality of second data lines, parallel to a long side of the array substrate;
a first integrated circuit, arranged in a short-side frame;
wherein the plurality of the second data lines are configured for connecting the first integrated circuit with the plurality of the first data lines; the first integrated circuit transmits data signal to the plurality of first data lines through the plurality of second data lines;
wherein the plurality of gate lines and the plurality of second data lines are located in same layer;
wherein an amount of the plurality of gate lines is same as an amount of the plurality of second data lines and both of them are m, and an amount of the plurality of first data lines is n;
wherein m>n, n second data lines of the m second data lines are connected to the n first data lines in one-to-one correspondence, and remaining second data lines are suspended;
wherein each of the first data lines and each of the second data lines are perpendicular to each other.

11. The array substrate of claim 10, wherein the plurality of gate lines are parallel to the long side of the array substrate and configured for transmitting scanning signal to each pixel on the array substrate, wherein each of the plurality of second data lines is parallel to each of the plurality of the gate lines.

12. The array substrate of claim 10, further comprising source and drain electrodes, wherein the plurality of the first data lines and the source and drain electrodes are located in same layer, a gate insulation layer is arranged between the plurality of first data lines and the plurality of second data lines, and each of the first data lines and its corresponding second data line are connected with each other through a via hole in the gate insulation layer.

13. The array substrate of claim 10, wherein at least one second data line connected to the first data line is arranged between two adjacent suspended second data lines.

14. The array substrate of claim 10, wherein n second data lines of the m second data lines are connected to the n first data lines in one-to-one correspondence; in condition that a portion of the first data lines are away from the first integrated circuit greater than or equal to a first distance, an additional second data line is arranged for each first data line of the portion of the first data lines.

* * * * *